Patented Apr. 8, 1952 2,591,915

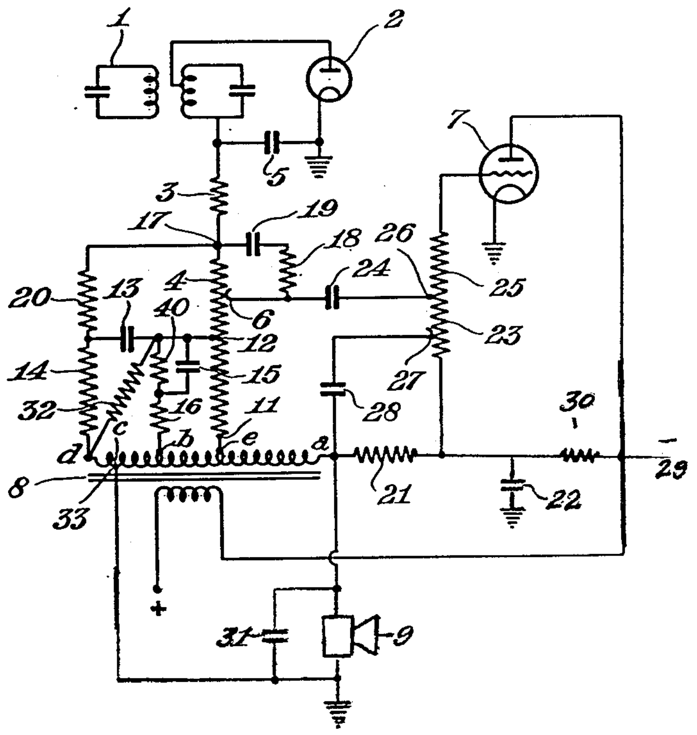
INVENTOR
HENRICUS ADRIANUS BROOS
BY
Fred M Vogel
AGENT.

UNITED STATES PATENT OFFICE 2,591,915

FEEDBACK AMPLIFIER CIRCUIT

Henricus Adrianus Broos, Eindhoven, Netherlands, assignor to Hartford National Bank and Trust Company, Hartford, Conn., as trustee Application July 12, 1949, Serial No. 104,335
In the Netherlands August 7, 1948

3 Claims. (Cl. 179—171)

This invention relates to low-frequency amplifying circuits comprising an electric discharge tube the input circuit of which includes a volume control having a movable contact and to which the oscillations to be amplified are supplied, the gain factor of the amplifier being controllable by means of the movable contact.

The U. S. patent application Serial Number 280,508, filed June 22, 1939, now abandoned, and the U. S. Patent 2,282,380 issued May 12, 1942 describe circuits of this kind in which sources of positive and negative feed-back voltage respectively, the voltages of which are proportional to the voltage generated in the output circuit of the amplifier, are included in the circuits in such manner that substantially no negative feed-back voltage or only a small negative feed-back voltage is effective at the top of the gain control and a high negative feed-back voltage is active at the bottom thereof. Such a circuit, comprising a so-called "loss-free" negative feed-back, enables the amplification of the amplifier to be controlled over a wide range, whilst if at an amplification of zero the movable contact is at the bottom of the gain control, the remaining voltage generated in the output circuit of the arrangement is substantially zero.

A similar circuit is also described in the prior patent application Serial Number 17,243, issued October 2, 1951 as Patent No. 2,569,973, which furthermore comprises frequency-dependent tone filters so proportioned that, when the movable contact of the gain control occupies a high position, low and high-tone frequencies are amplified to a smaller extent than the intermediate-tone frequencies, whereas when the said movable contact occupies a low position, the low and high-tone frequencies are amplified to a greater extent than the intermediate-tone frequencies.

The said circuits involve the disadvantage that, when the movable contact is moved to a lower position so that the signal generated in the output circuit of the amplifier is attenuated, the influence of poor conductivity between the movable contact and the resistance body of the potentiometer becomes manifest by increased "noise" of the amplifying circuit. This disadvantage may be avoided by connecting the bottom of the gain control to a source of higher negative feed-back voltage. However, in order to ensure sufficiently rapid control of the gain, the gain control then requires to have a higher resistance and this in turn aggravates the said disadvantage.

The invention provides a simple means of substantially avoiding the said disadvantage with the use of a known gain control having a third fixed contact between the top and the bottom.

According to the invention, the bottom of the gain control is connected to a source of high negative feed-back voltage and the top of the gain control is connected through an impedance having a value smaller than the full resistance of the gain control, to a source of comparatively small positive feed-back voltage, the third fixed contact of the gain control being connected through an impedance having a value smaller than that of the resistance portion of the gain control located between the third fixed contact and the bottom, to a source of negative feed-back voltage which is of an order of magnitude equal to that of the said source of positive feed-back voltage and smaller than the said source of high-negative feed-back voltage.

The invention will now be explained more fully by reference to the embodiment shown, by way of example, in the accompanying drawing. This example is in part identical with that shown in Fig. 1 of the prior patent application 17,243, the reference numerals used also being similar to those of the said figure.

The oscillations to be amplified, for example the low-frequency oscillations generated in the output circuit of a detector 2 of a radio-receiver, are supplied by way of a resistance 3 to a gain control 4, with a movable contact 6, which is included in the input circuit of an amplifying circuit 7. The gain of the amplifier is controllable by means of the movable contact 6. The output circuit of the amplifying tube 7 includes, if desired with the interposition of one or more amplifying tubes, an output transformer 8, the secondary winding 10 of which, is connected to a load, for example a loud-speaker 9, and is duplicated at the left at foot of the figure. The secondary winding 10 has a number of taps *a—e*, of which the tap *c* is connected to earth so that a source of positive feed-back voltage and sources of negative feed-back voltages are produced between the taps *c—d* and between the taps *c—b*, *c—e* and *c—a* respectively. The top 17 of the gain control 4 is connected through impedances 14 to 20 to the source *c—d* of positive feed-back voltage, a negative feed-back voltage being made operative at the bottom 11 of the gain control 4, the construction being such that substantially no negative feed-back or a small negative feed-back only is operative at the top of the gain control (loss-free feed-back).

The bottom 11 is connected to the source *c—e* of high negative feed-back voltage. A third fixed contact 12 provided between the top 17 and the bottom 11 of gain control 4 is connected through an impedance 16—40 which, within the frequency range to be amplified has a value smaller than that of the resistance portion of the gain control measured between the fixed contacts 11 and 12, to the source c—b of negative feed-back voltage which has, for example, a value 2 to 3 times smaller. The sources c—b and c—d are either of approximately equal value or the source c—b of negative feed-back voltage may have a value slightly larger than that of the source c—d of positive feed-back voltage.

The gain control has a resistance of 0.65 megohm between the fixed contacts 17 and 12 and a resistance of 2 megohms between the fixed contacts 12 and 11, the impedance of the resistance 16 and 40 together being, 0.2 megohm and that of the resistances 14 and 20 together being, 0.5 megohm.

With the circuit described it is ensured that, when the movable contact 6 of gain control 4 occupies a position near the top of the gain control, so that the gain of the amplifier is high, substantially no feed-back or a small negative feed-back only is effective in the amplifier. When the contact 6 moves downwards, substantial back-coupling of the amplifier will take place already in the vicinity of the fixed contact 12 so that the gain factor of the amplifier rapidly decreases, notwithstanding that the resistance portion of the gain control 4 located between the fixed contacts 17 and 12 may be of comparatively great length. Beyond the contact 12, the output signal is reduced to such extent that poor conductivity between the contact 6 and the resistance body of gain control 4 would become manifest as highly troublesome noise, were not any residual signal and hence noise itself suppressed by the very strong back-coupling.

The circuit according to the invention may be combined in a simple manner with that described in the prior patent application 17,243 in which the impedances between the sources c—d and c—b of positive and negative feedback voltages, the top 17 and the third fixed contact 12 of gain control 4, are so proportioned that, when the movable contact of the gain control occupies a high position, low and high-tone frequencies are amplified to a smaller extent than intermediate-tone frequencies whereas when the movable contact occupies a low position, the low- and high-tone frequencies are amplified to a greater extent than the intermediate-tone frequencies. As described in the afore-mentioned patent application, for this purpose an intermediate-tone filter comprising a condenser 13, a resistance 14, a condenser 15 and a resistance 16 is included between the fixed contact 12 of gain control 4 and the sources c—b and c—d of negative and positive feed-back voltage respectively so that, when the movable contact 6 is in the vicinity of the fixed contact 12, a strong negative feed-back of the intermediate-tone frequencies becomes effective.

Furthermore control of the high-tones may be effected with the use of a potentiometer 25 with movable contact 27, which is connected by way of a small condenser 28 to the source c—a of high negative feed-back voltage, a feed-back voltage of these low tone frequencies being effective at the bottom of potentiometer 25 through a filter 21, 22 passing the low-tone frequencies. As an alternative, instead of utilising the said tone control, provision may be made of the improved tone control circuit according to the prior patent application Serial Number 100,438, filed June 21, 1949.

What I claim is:

1. An electrical circuit arrangement for amplifying an input signal voltage having frequency values within a given range, comprising an electron discharge tube having an input circuit and an output circuit, a potentiometer having a top terminal, an intermediate terminal, a bottom terminal and a movable contact, said potentiometer having a first given resistance value between said top and bottom terminals and a second given resistance value between said intermediate and bottom terminals, means to apply said input signal voltage to said top terminal, means to intercouple said movable contact and said input circuit, means comprising a first impedance element having an impedance value smaller than said first given resistance value to derive a positive feedback voltage from said output circuit and to apply said positive feedback voltage to said top terminal, means comprising a second impedance element having an impedance value smaller than said second given resistance value to derive from said output circuit a first negative feedback voltage having an amplitude of the same order of magnitude as the amplitude of said positive feedback voltage and to apply said first negative feedback voltage to said intermediate terminal, and means to derive from said output circuit a second negative feedback voltage having an amplitude value relatively high with respect to the amplitude value of said positive feedback voltage and to apply said second negative feedback voltage to said bottom terminal.

2. An electrical circuit arrangement for amplifying an input signal voltage having frequency values within a given range, comprising an electron discharge tube having an input circuit and an output circuit, a potentiometer having a top terminal, an intermediate terminal, a bottom terminal and a movable contact, said potentiometer having a first given resistance value between said top and bottom terminals and a second given resistance value between said intermediate and bottom terminals, means to apply said input signal voltage to said top terminal, means to intercouple said movable contact and said input circuit, means comprising a first resistance element having a resistance value smaller than said first given resistance value to derive a positive feedback voltage from said output circuit and to apply said positive feedback voltage to said top terminal, means comprising a second resistance element having a resistance value smaller than said second given resistance value to derive from said output circuit a first negative feedback voltage having an amplitude substantially equal to the amplitude of said positive feedback voltage and to apply said first negative feedback voltage to said intermediate terminal, and means to derive from said output circuit a second negative feedback voltage having an amplitude value relatively high with respect to the amplitude value of said positive feedback voltage and to apply said second negative feedback voltage to said bottom terminal.

3. An electrical circuit arrangement for amplifying an input signal voltage having frequency values within a given range, comprising an electron discharge tube having an input circuit and an output circuit, a potentiometer having a top terminal, an intermediate terminal, a bottom terminal and a movable contact, said potentiometer having a first given resistance value between said top and bottom terminals and a second given resistance value between said intermediate and bottom terminals, means to apply said input signal voltage to said top terminal, means to intercouple said movable contact and said input circuit, means comprising a first impedance element having an impedance value smaller than said first given resistance value to derive a positive feedback voltage from said output circuit and to apply said positive feedback voltage to said top terminal, means comprising a second impedance element having an impedance value smaller than said second given resistance value to derive from said output circuit a first negative feedback voltage having an amplitude of the same order of magnitude as the amplitude of said positive feedback voltage and to apply said first negative feedback voltage to said intermediate terminal, means to derive from said output circuit a second negative feedback voltage having an amplitude value relatively high with respect to the amplitude value of said positive feedback voltage and to apply said second negative feedback voltage to said bottom terminal, and filter means intercoupling said output circuit and said potentiometer to produce along said potentiometer a negative feedback potential having at medium frequencies of said range an amplitude progressively greater toward said bottom terminal.

HENRICUS ADRIANUS BROOS.

REFERENCES CITED

The following references are of record in the file of this patent:

UNITED STATES PATENTS

| Number | Name | Date |
|---|---|---|
| 2,173,427 | Scott | Sept. 19, 1939 |
| 2,317,025 | Bond | Apr. 20, 1943 |
| 2,319,663 | Crowley | May 18, 1943 |
| 2,367,110 | Fayers | Jan. 9, 1945 |
| 2,374,071 | Barton | Apr. 17, 1945 |